United States Patent [19]

Skupnjak et al.

[11] Patent Number: 4,571,709
[45] Date of Patent: Feb. 18, 1986

[54] TIMING APPARATUS FOR NON-VOLATILE MOS RAM

[75] Inventors: Joseph A. Skupnjak, San Jose; Douglas J. Lee; Neil J. Becker, both of Santa Clara, all of Calif.

[73] Assignee: Intel Corporation, Santa Clara, Calif.

[21] Appl. No.: 462,190

[22] Filed: Jan. 31, 1983

[51] Int. Cl.⁴ .............................................. G11C 7/00
[52] U.S. Cl. .................................... 365/233; 365/189
[58] Field of Search .............. 365/230, 233, 189, 190, 365/211

[56] References Cited

U.S. PATENT DOCUMENTS

| | | | |
|---|---|---|---|
| 4,208,729 | 6/1980 | Williams | 365/184 |
| 4,210,959 | 7/1980 | Wozniak | 364/200 |
| 4,503,518 | 3/1985 | Iwahashi | 365/104 |

Primary Examiner—James W. Moffitt
Attorney, Agent, or Firm—Blakely, Sokoloff, Taylor & Zafman

[57] ABSTRACT

A non-volatile memory and in particular the timing apparatus for generating sequence of signals needed for storing and recalling data is described. The memory cell employs an $E^2$ cell which is coupled to a bistable (static) RAM cell. "State machine" logic is employed to obtain the proper sequence of signals needed for storing and recalling.

13 Claims, 8 Drawing Figures

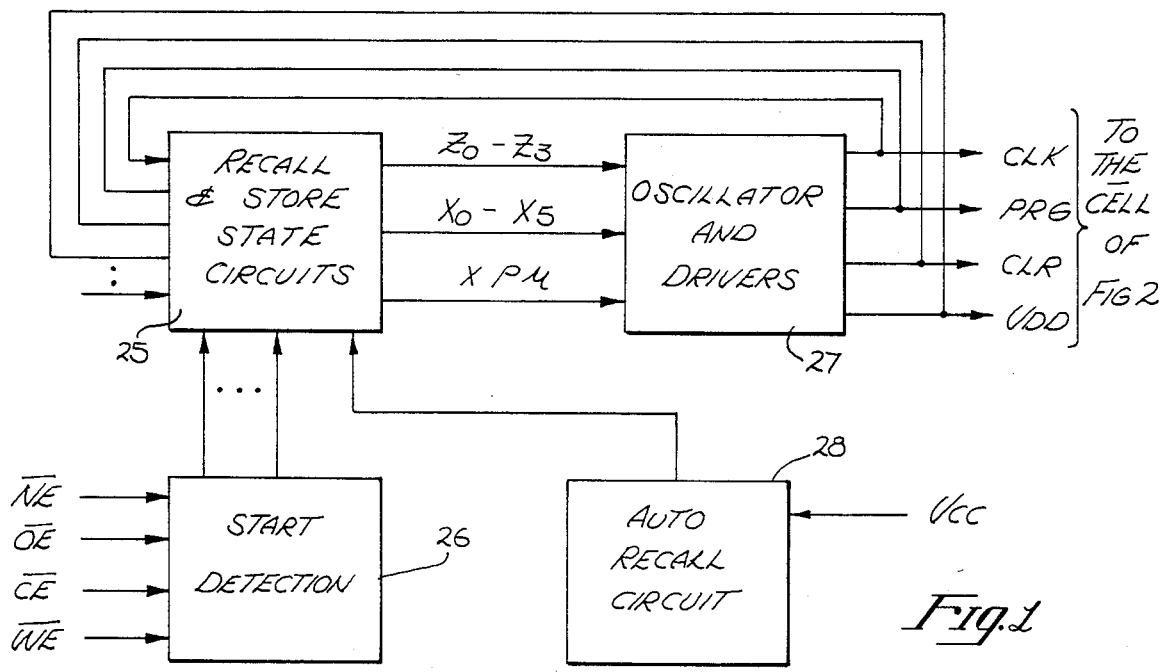
RECALL AND STORE TIMING BLOCK DIAGRAM
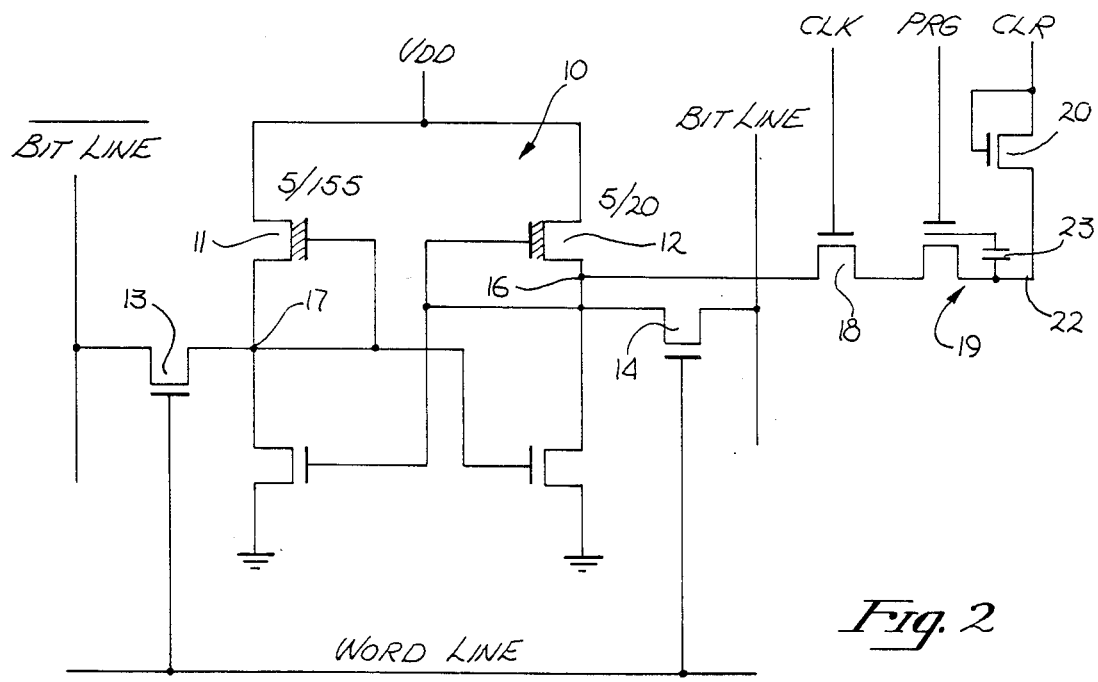
MEMORY CELL

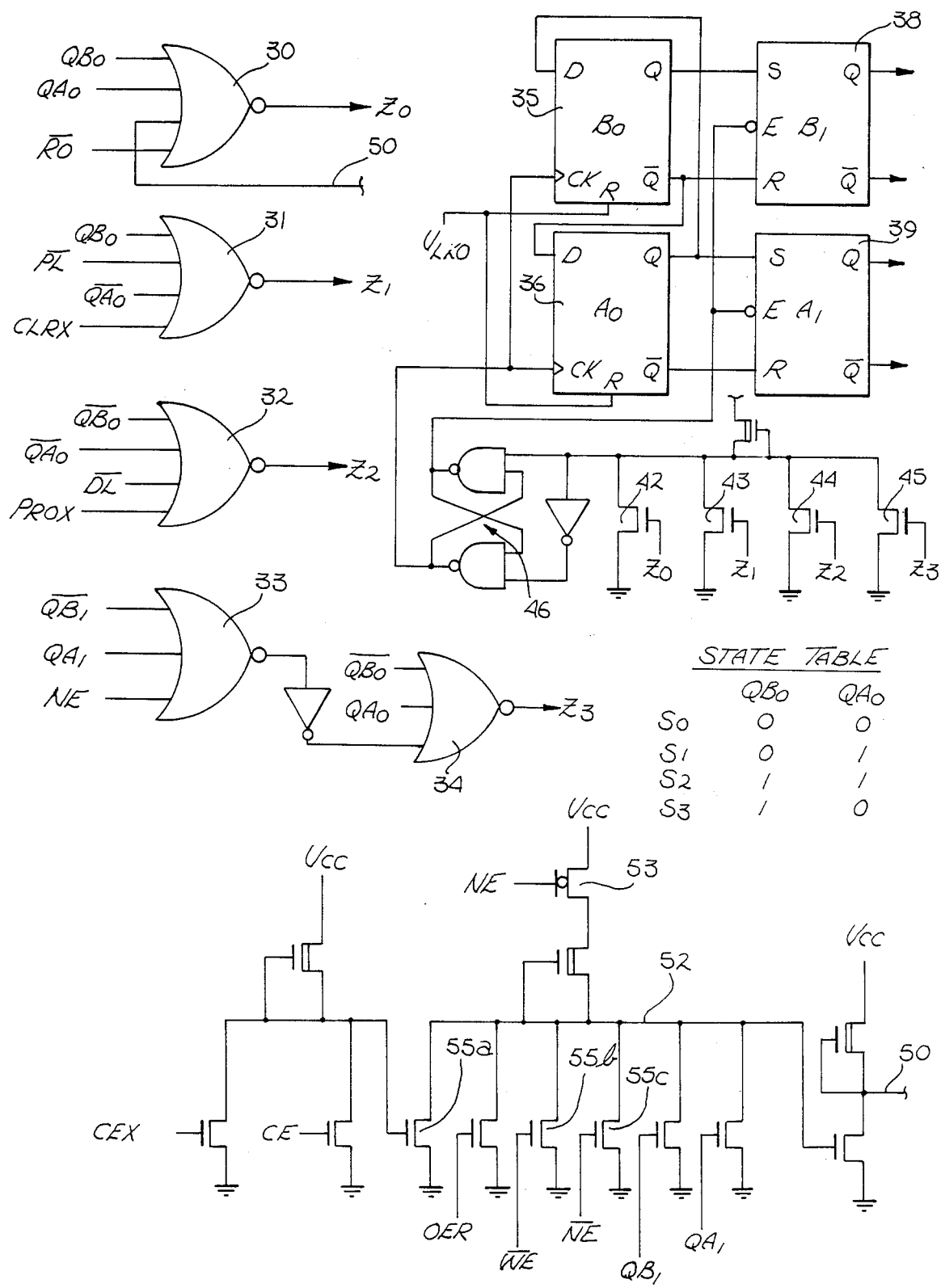
Fig. 3   STORE STATE TIMING CIRCUIT

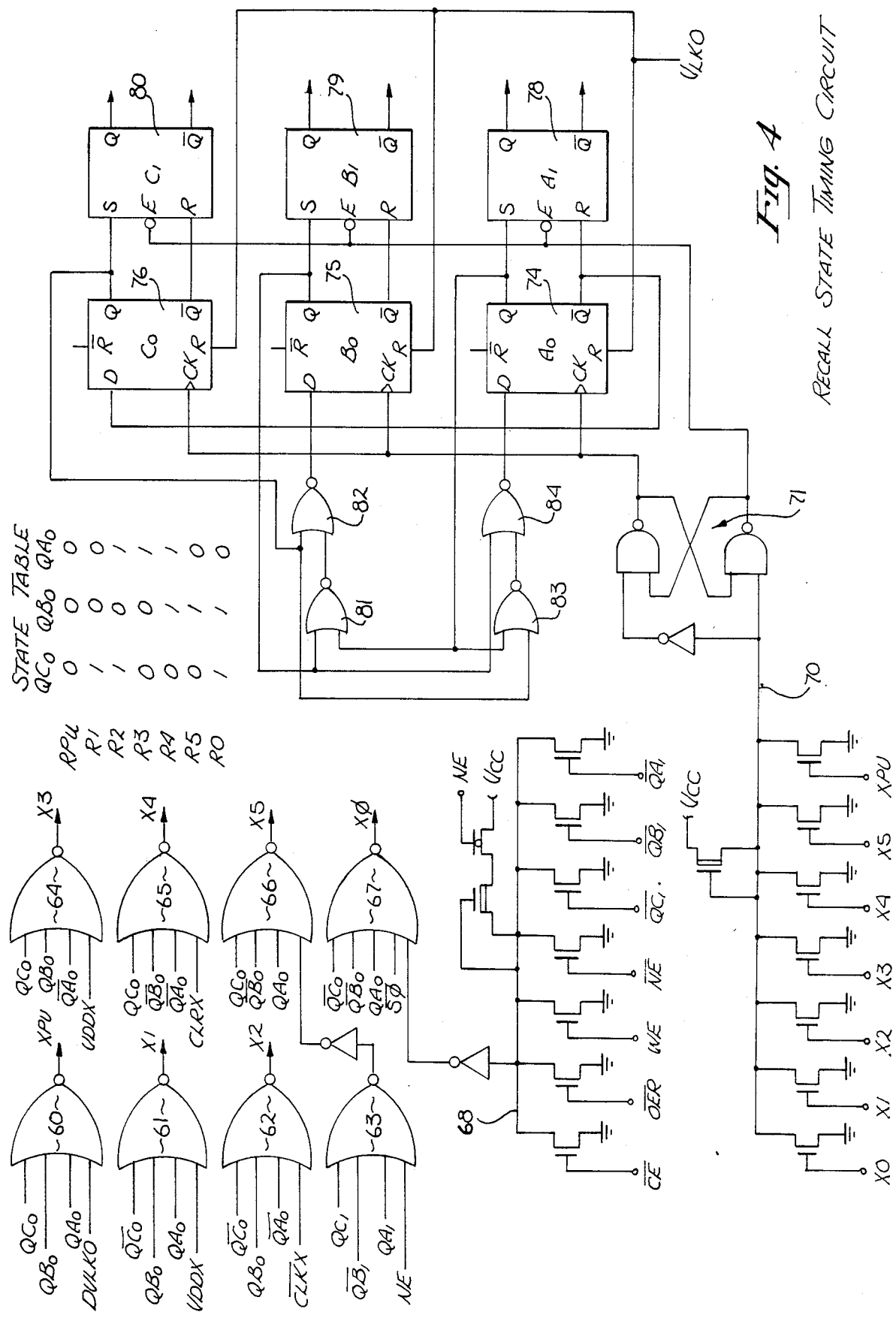
Fig. 4  Recall State Timing Circuit

AUTO RECALL CIRCUIT

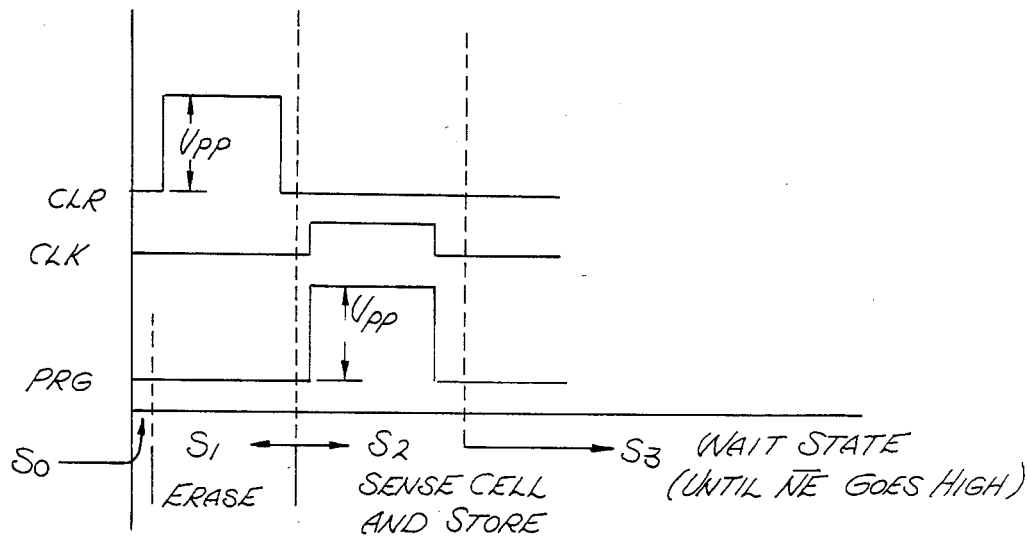
STORE – SEQUENCE
Fig. 7
Fig. 8
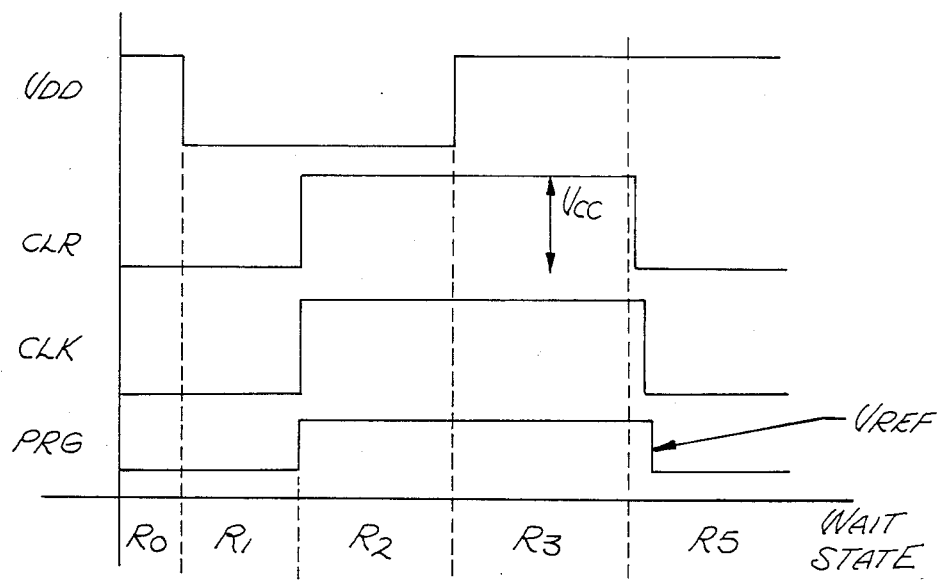
RECALL – SEQUENCE

4,571,709

TIMING APPARATUS FOR NON-VOLATILE MOS RAM

BACKGROUND OF THE INVENTION

1. Field of the Invention.

The invention relates to non-volatile MOS memories.

2. Prior Art.

In some applications it is important to retain data stored in a random-access memory (RAM) after power is interrupted. This data may not be stored in any other location, and hence would be lost upon the failure of power. Cash registers and many other terminals are examples of where data is initially placed in RAM. If power fails before this data is stored in a more permanent memory, it would be lost.

Most often, the power supplies for these memories have considerable capacitance and even after power is lost, sufficient energy remains to operate the memory for several seconds. In non-volatile memories the loss of power is immediately sensed, and action taken to preserve the data in RAM before the energy is dissipated from the power supply.

Numerous prior art RAM cells are known which retain information when de-activated. One category of these devices employs a silicon nitride layer (MNOS devices) to selectively store charge when the cell is powered-down. Another category of non-volatile RAM cells employ electrically programmable and electrically erasable floating gate devices such as shown in U.S. Pat. No. 4,207,615.

The described invention uses the non-volatile memory cell described in co-pending application, Ser. No. 300,000, filed on Sept. 8, 1981 now U.S. Pat. No. 4,400,799, and assigned to the assignee of the present invention. This cell includes a static, bistable circuit (flip-flop) for non-volatile RAM operation and an electrically programmable and electrically erasable floating gate memory (E $^2$PROM) device to provide the non-volatile feature. A first sequence of signals are required to store data and a second sequence of signals are required to recall data from these cells. The present invention is directed towards an apparatus for providing these signals and other features for a non-volatile memory.

The timing apparatus of the present invention operates within the non-volatile memory in a manner analogous to a logic circuit sometimes referred to as a "state machine". State machines have been used in various applications such as for controlling the flow of data to and from a disk drive, see U.S. Pat. No. 4,210,959. Applicant is not aware of any logic circuit which employs state machines in a non-volatile memory or as used in the present invention.

SUMMARY OF THE INVENTION

An integrated circuit, metal-oxide-semiconductor (MOS) non-volatile memory is described. It includes a plurality of non-volatile memory cells requiring a first predetermined sequence of first signals for non-volatile storage and a second predetermined sequence of second signals for recalling stored data. Driver circuits coupled to the cells, are used for generating the first and second signals. A state logic means coupled to the driver circuits, initiates the generation of the first and second sequence of the signals. It includes a plurality of logic circuits, each of which has discrete states. The output signals from these circuits are coupled as inputs to the logic circuits for determining the logic states. Also, the first and second signals are coupled as inputs to the logic circuits for determining the logic states. Control circuit means receives a plurality of externally generated control signals and generates internal control signals which are coupled as input to the logic circuits and also used to determine the logic state. The logic circuit assures that the first and second signals are generated in the proper sequence for storing and recalling data.

BRIEF DESCRIPTION OF THE DRAWINGS

FIG. 1 is a block diagram illustrating the apparatus of the present invention.

FIG. 2 is an electrical schematic of the non-volatile memory cell used with the present invention.

FIG. 3 is an electrical schematic of the logic circuits for generating the store signals.

FIG. 4 is an electrical schematic of the logic circuits circuits for generating the recall signals.

FIG. 7 is a pulse diagram for the store sequence.

FIG. 8 is a pulse diagram for the recall sequence.

DETAILED DESCRIPTION OF THE INVENTION

Figure 5:
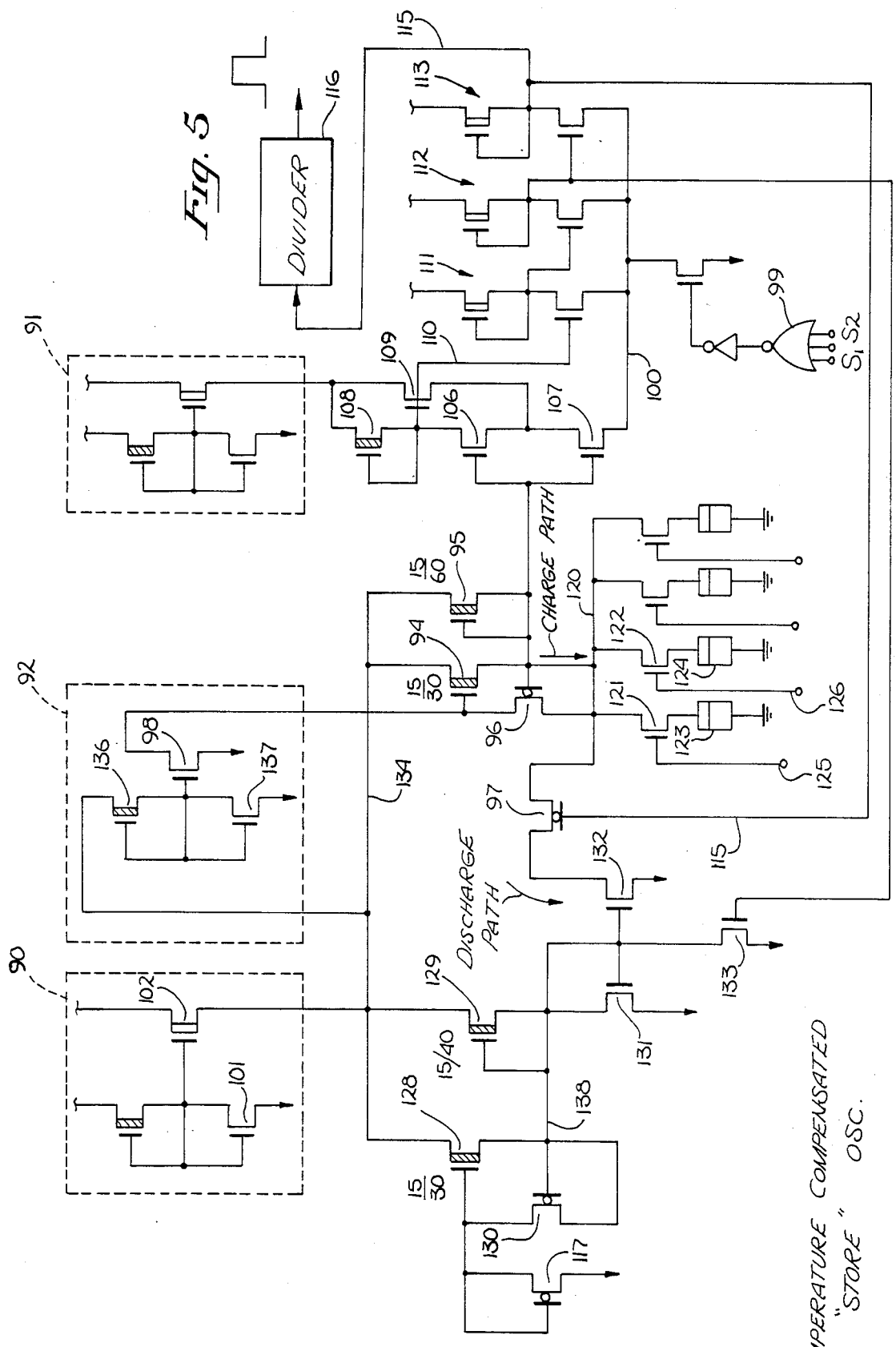
FIG. 5 is an electrical schematic of a temperature compensated oscillator used for generating certain store signals.

A timing apparatus for use in a non-volatile, random-access memory is described. In the following description, numerous specific details are set forth such as specific logic gates, in order to provide a thorough understanding of the present invention. It will, however, be obvious to one skilled in the art that the present invention may be practiced without these details. In other instances, well-known circuits are shown in block diagram form in order not to unnecessarily obscure the present invention.

As presently realized, the invention is used as part of a 4k, non-volatile (NV) random-access memory (RAM). The memory is organized in a 512×8 array and fabricated employing known metal-oxide-semiconductor (MOS) n-channel, silicon gate technology. Other technologies may be employed to realize the present invention.

THE NV RAM CELL

The described memory employs the memory cells shown in FIG. 2. This cell is described in more detail in co-pending application, Ser. No. 300,000, filed on Sept. 8, 1981 now U.S. Pat. No. 4,400,799 which is assigned to the assignee of the present invention.

The memory cell of FIG. 2 includes a bistable circuit 10 (flip-flop) having a slight imbalance in the loads. The channel dimensions (Z/L) for the depletion mode transistors 11 and 12 are different as indicated. If no external bias is applied to the bistable circuit 10 when the power VDD is applied, the circuit will assume a predetermined state as is well-known. The bistable circuit 10 operates in an ordinary manner as a RAM cell and to that extent is coupled to complementary bit lines through transistors 13 and 14. These transistors have their gates coupled to a word line. Node 16 of the bistable circuit 10 is coupled to an E$^2$PROM cell 19 through transistor 18. One terminal of the E$^2$ cell 19 is coupled through transistor 20 to the source of the clear (CLR)

signal. The transistors 18 and 20, and E² cell 19 provide the non-volatile feature for each memory cell in the NV RAM.

The memory E² cell 19 comprises a well-known E²-PROM device having a floating gate in which charge is stored. Charge is transferred to and from this floating gate through a tunnel oxide region represented in FIG. 2 by capacitor 23. E²PROM cells are described in more detail in U.S. Pat. No. 4,203,158. To place a charge in the floating gate, (programmed cell) a potential of approximately 20 volts is applied to the control gate of the cell (PRG signal) while node 22 is held low (grounded). This causes charge to be tunneled into the floating gate. To remove charge from the floating gate, the control gate is held low, while a voltage of approximately 20 volts is applied to node 22. When the floating gate is negatively charged (programmed) the E² cell does not conduct when a reference potential ($V_{ref}$) is applied to the control gate. On the other hand, if the floating gate is not charged when this reference potential is applied to the control gate, the cell 19 conducts. The programming signal applied to the control gate and the clear signal to discharge the floating gate applied to node 22 through transistor 20, typically have ramped waveforms and as currently preferred has a duration of approximately 10 msec.

GENERAL OPERATION OF THE NV CELL FOR STORING AND RECALLING DATA

Before examining the timing apparatus of the present invention, it will be helpful to understand the operation of the NV RAM cell, particularly during a store and recall sequence. During normal operation of the memory, the bistable circuit 10 operates in an ordinary fashion since the imbalance in loads have virtually no effect upon the operation of the bistable circuit. During this operation, the store state timing circuit of FIG. 3 is in the $S_0$ state (see FIG. 7) and the recall state timing circuit of FIG. 4 is in the $R_0$ state (see FIG. 8). During this operation VDD is high (e.g., 5 volts) and the CLK, PRG, and the CLR signals are low.

Assume now that it is necessary to non-volatily store the state of circuit 10. This can occur if circuitry external to the memory detects a power failure and applies control signals to the memory, initiating a store sequence. The sequence may also be activated at any time by application of external control signals where it is desirable to store data in the E² devices for later recall to the RAM. The store sequence begins with the removal of charge (if any) from the floating gate of the E² cell 19. This occurs during state S1 of FIG. 7. The clear signal (CLR) rises in potential to approximately 20 volts while the CLK and PRG signals remain low. Consequently, all the floating gates in the array are discharged. In some cases, the gate will not have been previously programmed and the application of the clear signal will not effect this E² cell. After the clear signal drops in potential, node 22 (FIG. 2) remains charged to the VPP potential.

During state S2, the program potential rises to $V_{pp}$ and the CLK signal rises, causing transistor 18 to conduct. (See the waveforms of FIG. 7). If node 16 of the bistable circuit 10 is high, node 22 remains charged and the floating gate of the E² cell 19 does not charge. On the other hand, if node 16 is low, the charge on node 22 is dissipated through transistor 18 and the floating gate becomes charged.

During the recall cycle first VDD is brought to ground potential as shown by state R1 of FIG. 8. During state R2, the CLR signal rises to 5 volts and the CLK signal to a lower potential. The control gate of cell 19 is brought to a reference potential. If the floating gate of cell 19 was not charged during the store sequence, cell 19 conducts clamping node 16 to approximately 1.5 volts. During state R3, the VDD potential is applied to the cell, and if node 16 is high, the bistable circuit is set with node 16 high. If during the store cycle, the floating gate of cell 19 was charged, then cell 19 does not conduct and the potential from the CLR line is not coupled through transistor 18 to node 16. For this case when the VDD potential rises, transistor 11 conducts more than transistor 19, pulling node 17 to VDD and node 16 to ground.

Thus, the E²PROM cell 19 provides non-volatile storage and assures that the bistable circuit 10 returns to the state it was in when the non-volatile store occurred by a recall operation.

BLOCK DIAGRAM OF FIG. 1

Referring now to FIG. 1, the timing apparatus includes the recall and store state circuits 25, the start detection circuit 26, oscillator and drivers 27, and the auto recall circuit 28. All of these circuits are fabricated as an integrated circuit on the substrate which includes the memory array, and other well-known memory circuits, such as decoders, address buffers, read-write buffers, etc.

The start detection circuit 26 receives four externally applied enabling signals, $\overline{NE}$ (non-volatile enable), $\overline{OE}$ (output enable), $\overline{CE}$ (chip enable), and $\overline{WE}$ (write enable). Some of these signals and their complements and related signals are used by the store state timing circuit of FIG. 3 and recall state timing circuit of FIG. 4. (The use of these signals in other parts of the memory is not shown.)

In general, the $\overline{CE}$ signal is the master chip select signal and the chip is selected only when this signal is low. The $\overline{WE}$ and $\overline{OE}$ signal control the reading and writing from memory in an ordinary manner, the $\overline{NE}$ signal is high during both reading and writing. The recall and store functions are selected when the $\overline{NE}$ signal is low. Recall is selected when the $\overline{OE}$ signal is low with $\overline{NE}$ being low. ($\overline{WE}$ high) Store is selected when the $\overline{WE}$ signal is low with the $\overline{NE}$ signal low ($\overline{OE}$ high). As mentioned, circuits external to the memory detect when power has failed and initiate a store sequence by bringing $\overline{NE}$ and $\overline{WE}$ low. Of course, a user can start the store sequence at any time and not necessarily when the power fails. As will be seen, recall occurs automatically when power is applied to the memory or by bringing both $\overline{NE}$ and $\overline{OE}$ low.

The state detection circuit 26 is an ordinary logic circuit for providing control signals for the timing apparatus shown particularly in FIGS. 3 and 4. In general, the circuits of FIGS. 3 and 4 comprise discrete logic circuits primarily bistable circuits and gates (NOR gates). The inputs to these logic circuits include the outputs of some of the logic circuits and the CLK, CLR, PRG and VDD signals. Two separate "state machines" are employed, FIG. 3 shows the store circuitry while FIG. 4 the recall circuitry. The output from the circuits of FIGS. 3 and 4 initiate the CLK, PRG, CLR and VDD signals in the proper sequence. The signals $Z_o$ through $Z_3$ initiate the proper sequence of signals to provide the states $S_1$ through $S_3$ shown in FIG. 7. Similarly, the signals $X_0$ through $X_5$ cause the drivers to initiate the proper sequence of the CLK, PRG, CLR, Vref and VDD to provide the states $R_0$ through $R_5$ shown in FIG. 8. The XPU signal causes the RPU state which will be described. The drivers 27 are ordinary circuits for providing the required potential levels, power and switching for the CLK, PRG, VDD and Vref signals.

An oscillator is used to control the duration of the high voltage (20 volt) PRG and CLR signals. As mentioned, it is desirable for this signal to have a duration of approximately 10 msec. A temperature compensated oscillator is used to provide a constant frequency signal which when divided, provides the proper pulse width. The temperature compensated oscillator is shown in FIG. 5.

When power is initially applied to the memory, the auto recall circuit 28 (shown in detail in FIG. 6) determines when the power applied to the memory has reached a sufficient level to allow a recall. This circuit also inhibits a store sequence when the power supply potential has dropped too low to allow a store sequence.

STORE STATE TIMING CIRCUIT

The store state timing circuit of FIG. 3 includes NOR gates 30, 31, 32, 33 and 34. The output of NOR gate 33 provides an input to the NOR gate 34 through an inverter. The outputs of NOR gates 30, 31, 32 and 34 initiate the states S0, S1, S2 and S3 ($S_0$, $S_1$, $S_2$ and $S_3$ represent the binary state for the state timing circuit as shown by the state table of FIG. 3; the subscripts represent different states (e.g., different times). More specifically, when the memory is first powered up, the store state circuit of FIG. 3 is in state S0. When an output occurs from gate 30 ($Z_0$ high) the circuit store state timing changes to state S1. When an output occurs from gate 31, the circuit store state timing changes to state $S_2$. When an output occurs from gate 32, the circuit store state timing changes to state $S_3$ and finally, when an output occurs from gate 34, the circuit returns to the $S_0$ state. The state is determined by the state of the bistable D-type flip-flops 35 and 36. These flip-flops set their Q terminal to the input on the D terminal on the falling edge of a clock signal. The flip-flops reset to Q low when the reset signal is applied. SR latches 38 and 39 are ordinary latches that set Q and $\overline{Q}$ to S and R, respectively, when the signal applied to the E terminal goes low. The Q output of flip-flop 36 ($QA_0$) provides an input to the flip-flop 35. The $\overline{Q}$ output of flip-flop 35 ($\overline{QB_0}$ provides an input to flip-flop 36. The $B_0$ flip-flop 35 controls the input to the $B_1$ latch 38. Similarly, the Q and $\overline{Q}$ output of the $A_0$ flip-flop 36 provides the input for the $A_1$ latch 39. The outputs of latches 38 and 39 provide inputs (e.g., $QA_1$ and $QB_1$) to various transistors coupled to line 52 and to gates such as the $\overline{QB_1}$ input to gate 33.

Any time either the $Z_0$, $Z_1$, $Z_2$, or $Z_3$ signal rises in potential, transistors 42, 43, 44, or 45 respectively conduct, causing the cross-coupled NAND gates 46 to generate non-overlapping clock signals for the flip-flops 35 and 36 and latches 38 and 39. The VLKO signal from FIG. 6 resets the flip-flops 35 and 36 so that the Q outputs of these circuits are low. As may be seen from the state table included in FIG. 3, this is defined as the $S_0$ state and as may be further seen from FIG. 7, the store sequence is not in process in this state.

While the memory is initially powered up, recall occurs, and thus, the $\overline{R_0}$ input to gate 30 is high. No output can occur from gate 30 until this input drops in potential. This prevents a store sequence when a recall sequence is occurring. Similarly, as will be seen, there is a cross connection between the store state timing circuit and the recall state timing circuit to prevent a recall when a store sequence is in process.

The signal on line 50 (see lower right hand part of FIG. 3 and input terminal of gate 30) is initially high. This signal is derived from the decoder-like circuit shown at the bottom of FIG. 3. Initially, line 50 is drawn to $V_{CC}$ since node 52 is low. During these initial conditions, the NE signal is low.

Assume now that non-volatile enable is selected. This selection is detected by the circuit 26 of FIG. 3. When NE goes high, transistor 53 conducts. The other transistors such as transistors 55a, 55b, and 55c do not conduct. ($\overline{NE}$ and $\overline{WE}$ are both low during a store sequence as previously discussed.) $QB_1$ and $QA_1$ are likewise low (Q terminals of registers 38 and 39 are low). OER is an internally generated output enable signal and this signal is also low at this time. The chip enable signal is high, preventing transistor 55a from conducting. (CEX is a test signal only used in a test mode and not pertinent to the present discussion.) Thus, when the store cycle is selected, the potential on line 50 drops, and assuming $\overline{R0}$ is now low, an output occurs from gate 30. This output causes transistor 42 to conduct and provides clocking signals from the cross-coupled gates 46. The Q output from flip-flops 35 goes low while the Q output from the circuit 36 become high. For these conditions, the S1 state exists and the signals shown in FIG. 7 for erasing the $E^2$PROM cell occur.

Referring now to gate 31, for the S2 state to occur an output must occur from this gate. From the conditions above discussed, $QB_0$ is low and $\overline{QA_0}$ is high. The CLR $_x$ signal (equivalent to the CLR signal) remains high for 10 msec., the period ideal for erasing the $E^2$ cells. The $\overline{PL}$ signal is a timing signal derived from the oscillator and dividers of FIG. 5 and this signal drops in potential afer 10 msec. When this occurs, the $Z_1$ signals rises, transistor 43 conducts, clocking signals are generated and the flip-flops 35 and 36 change state such that the Q terminal of both these flip-flops are high. This is the $S_2$ state shown in FIG. 7 and the state table of FIG. 3.

After the PROX signal (5 volt equivalent of the PRG signal) drops in potential and the $\overline{DL}$ signal drops, an output occurs from gate 32. (The $\overline{DL}$ signal is another timing signal from the oscillator and divider of FIG. 5 which occurs after the 10 msec duration of the PRG signal.) Transistor 44 now conducts and the $\overline{Q}$ output of register 38 becomes low, as does the Q output of register 39. Thus, the conditions of gate 33 are met, except that NE remains high. In the S3 state a store, or for that matter, recall cannot occur until such time as the $\overline{NE}$ signal rises in potential. When this occurs, the $Z_3$ output occurs at gate 34 and the circuit of FIG. 3 returns to its $S_0$ state.

RECALL STATE TIMING CIRCUIT

The timing circuit of FIG. 4 is configured and operates in a similar manner to the circuit of FIG. 3. The NOR gates 60–67 receive as inputs the signals applied to the cells, specifically $V_{DD}$, CLR, and CLK. These NOR gates also receive as inputs signals from the bistable circuits 74, 75 and 76 ($A_0$, $B_0$, and $C_0$, respectively) and the registers 78, 79 and 80 ($A_1$, $B_1$, and $C_1$, respectively). The outputs from the flip-flops 74, 75 and 76 are coupled through the NOR gates 81, 82, 83 and 84 to provide inputs to others of the flip-flops. As was the case in FIG. 3, the flip-flops directly drive the registers.

A change from the $R_0$ state to the $R_1$ state occurs when an output signal is generated at the output of the gate 67. If all the inputs to this gate are low, this output occurs. The output is prohibited so long as a recall is in progress since $\overline{SO}$ is an input to gate 67. When the node 68 rises in potential, a transition occurs from state $R_0$ to $R_1$. For this condition, $\overline{CE}$ must be low, WE low, $\overline{NE}$ low and $QA_1$, $QB_1$ and $QC_1$ low (NE is high). Once again, a change of state occurs when the signals $X_0$ through $X_{PU}$ go high and a pulse on line 70 generates a clocking signal through the cross-coupled NOR gates 71.

The state table included with FIG. 4 shows the Q state each state of the $A_0$, $B_0$, and $C_0$ flip-flops for each of the timing state RPU through Ro.

Unlike the timing circuit of FIG. 3, when power is initially applied, the DVLKO signal sets the flip-flops 74, 75 and 76 with their Q outputs low. (This signal initially rises and then drops in potential as will be seen from the circuit of FIG. 6.) The delay VLKO signal applied to gate 60 causes an output from gate 60 when it drops in potential. This changes the state from RPU to R1. Then as with the case of the circuit of FIG. 3, the states change from $R_1$, $R_2$, $R_3$, $R_4$ and $R_5$. When the NE signal at gate 63 falls in potential, a change occurs to the RO state, this being the state for normal RAM operation.

If a recall is to be initiated by other than the VLKO signal, the potential on line 68 must rise and this of course can be done by the application of the external control signals. Thus, state R1 can be reached in two ways. First, when power is applied, the recall cycle is automatically initiated since RPU is the initial state and a change automatically occurs to $R_1$ when the VLKO signal rises and then falls. After this initial recall, the $R_0$ state is reached. At any time another recall can be initiated by external control signals which cause the potential on node 68 to rise. Thus, unlike store in the presently preferred embodiment, there is both an automatic recall and a user initiated recall.

TEMPERATURE COMPENSATED OSCILLATOR

The temperature compensated oscillator of FIG. 5 in the presently preferred embodiment has periods of oscillation of approximately 1.2 microsec. The capacitors coupled to node 120 such as capacitors 123 and 124 are charged and discharged providing the source of oscillations. The node is charged through a temperature compensated constant current source comprising transistors 94, 95 and 96 at a current rate "I" and discharged through a temperature compensated current mirror at a rate of 2I through transistors 97 and 132. The potential on node 120 is sensed by a Schmitt trigger which includes transistors 106, 107, 108 and 109. The output of this trigger, line 110, is coupled through the buffer stages 111, 112 and 113 to the line 115. The charging and discharging of node 120 is controlled by the feedback on line 115 which is coupled to the gate of transistor 97, and also the complement of this signal which is coupled from the output of buffer state 112 to the gate of transistor 133. The potential on line 115 is divided by divider 116 to provide a 1.2 msec. period for controlling the programming and clear signals as discussed above.

The oscillator of FIG. 5 operates only during the $S_1$ and $S_2$ states. When the inputs to the NOR gates 99 are low, node 100 has no path to ground, and this prevents the oscillator from operating. When S1 or S2 are high, the oscillator operates. (The third input to the gate 99 is used for testing.)

The circuit of FIG. 5 employs four different transistor types. It uses standard enhancement mode and depletion mode transistors represented for instance by the transistors 101 and 102, respectively. It also uses transistors which have a threshold of approximately zero volts, such as transistors 96 and 97. Weak depletion transistors such as transistor 129 are also used having a threshold voltage of less than −1 volt.

The oscillator also includes E$^2$PROM cells which are not shown. These cells are used for "trimming" and allow discretionary potentials to be applied to lines 125, 126 and like lines. During probe testing the frequency of the oscillator is measured. It is then determined what additional capacitance must be coupled to node 120 to provide the desired frequency. If, for instance, it is determined that capacitor 123 must be added to node 120, the E$^2$PROM cell associated with line 125 is programmed so as to cause transistor 121 to conduct, thereby coupling capacitor 123 to node 120. The capacitors 123, 124 and like capacitors are binary weighted to allow a larger range of capacitance adjustment at node 120. The nominal frequency of oscillation (with no capacitors) is such that additional capacitance is required to achieve the desired frequency.

A relatively constant potential of approximately four volts is provided at node 134. This potential is developed through the circuit shown within the dotted line 90. The threshold voltage of the enhancement mode transistor 101 is subtracted from the threshold voltage of the depletion mode transistor 102 to provide this constant potential. The threshold voltages of these transistors with respect to temperature and power supply variations change in opposite directions, thus providing compensation for these variations. For a more detailed discussion of this prior art circuit, see U.S. Pat. No. 4,100,437. A similar circuit is shown within dotted line 91 and is used to provide a constant potential for the Schmitt trigger.

The node 120, as mentioned, is charged through a constant current source comprising transistors 94 and 95. The transistor 96 provides temperature compensation to this charging path. Transistor 96 may be considered to be a diode between the source and gate of transistor 94. This diode has a positive temperature coefficient whereas the transistor 94 has a negative temperature coefficient. Transistor 96 overcompensates and for this reason transistor 95 is added. With the ratio of sizes of transistors 94 and 95 as indicated, excellent temperature compensation is provided by transistor 96. A "leaker" is provided from the gate of transistor 94 through the circuit shown within dotted line 92. Dynamic leaking is required since the potential on node 120 is continually changing. The potential on the gate of transistor 98 is established through a current mirror comprising transistors 136 and 137.

In the discharge path a constant current source comprising transistors 128, 129 and temperature compensation through transistor 130 is provided. The current through this path and through transistor 131 establishes the current 2I through transistor 132. Leaking occurs through transistor 117. Dynamic leaking is not required since node 138 (unlike node 120) is not being charged and discharged. (The ratio of the sizes of transistors 128 and 129 is different than that of transistors 94 and 94 since node 138 is biased at a different potential.

The above-described oscillator with its temperature compensated charging and discharging paths has been found to provide excellent temperature-stable performance.

AUTO RECALL CIRCUIT

Figure 6:
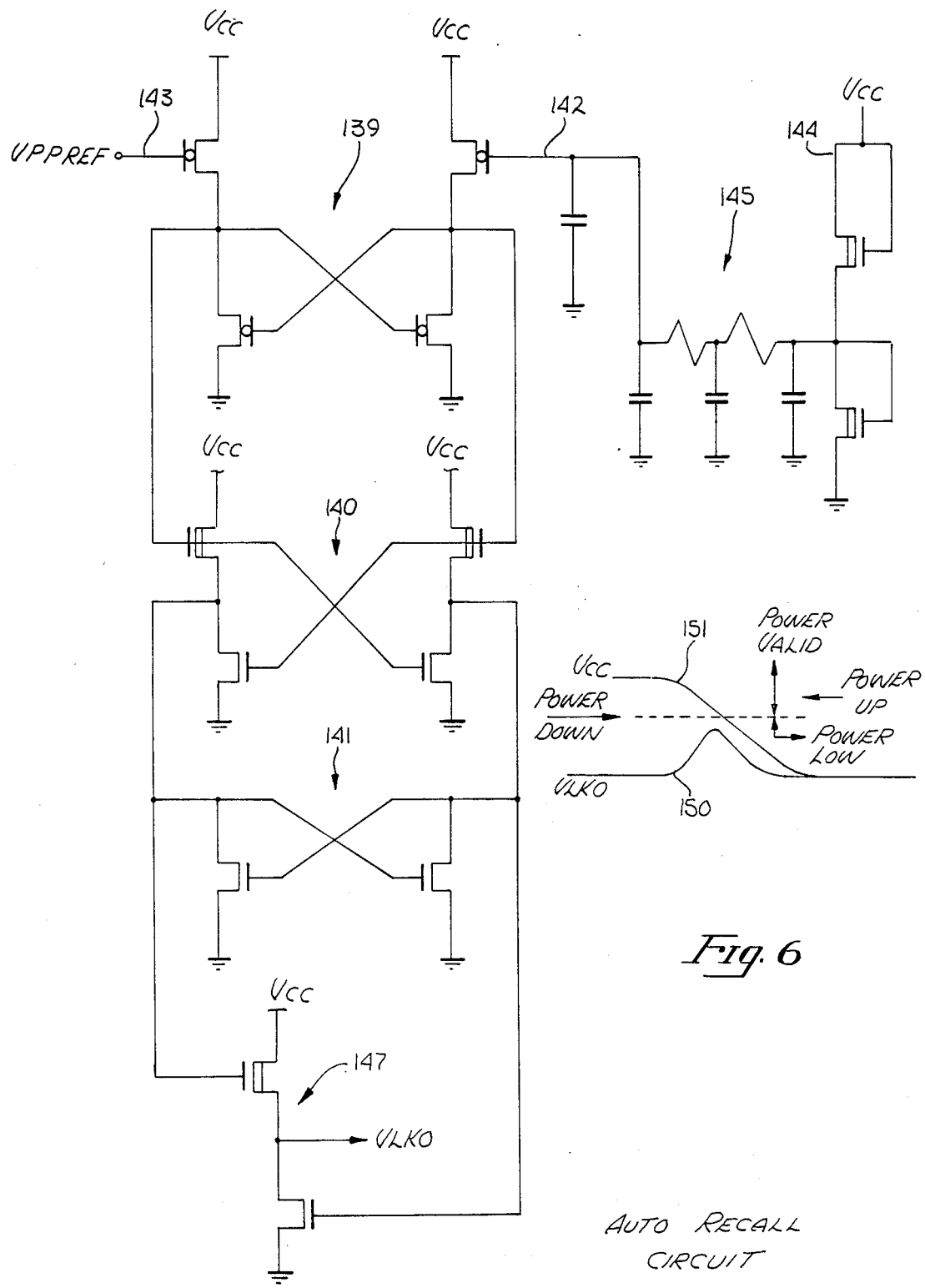
FIG. 6 is an electrical schematic of a voltage sensing circuit used in the presently preferred embodiment.

The auto recall circuit of FIG. 6 compares the power applied to the memory ($V_{CC}$) with a reference potential. The output of this circuit, VLKO, provides a pulse as shown by waveform 150 when $V_{CC}$ (waveform 151) falls below a predetermined potential. The $V_{CC}$ input to the circuit of FIG. 6 is line 144. The potential is passed through a lowpass filter 145 to filter out the high frequency components. The effective input to the recall circuit is line 142. This input is compared with a reference potential of approximately 3 volts from line 143. The $V_{pp}$ potential is generated on chip using a charge pump circuit and is regulated by the reference potential of approximately 3 volts. See copending application, Ser. No. 462,192 now U.S. Pat. No. 4,527,180, filed Jan. 31, 1983, entitled MOS DIVIDER STRUCTURE, assigned to the assignee of the present invention for a discussion of the generation of the reference potential on line 143. The cross coupled stage 139 is coupled to a second stage 140 which in turn controls the latch 141. The output voltage VLKO is obtained at the final stage 147.

The waveforms for $V_{CC}$ and VLKO are shown in FIG. 6, both when power is lost (left to right) and during power-up (right to left). At the point where the power is too low, the VLKO signal rises and is used to prevent a store sequence since the power is already too low, and in the other direction during power-up, the rise in VLKO signal is used to initiate a recall.

As previously mentioned, the VLKO potential initiates recall on power-up and prevents a store when $V_{CC}$ has dropped too much for a store cycle to occur.

Thus, a non-volatile random-access memory has been described, and in particular, the timing apparatus used to sequence signals needed for storing and recalling data from the described memory cells.

We claim:

1. An integrated circuit, metal-oxide-semiconductor, non-volatile memory comprising:
    a plurality of non-volatile memory cells requiring a first predetermined sequence of first signals for non-volatile storage of data and a second predetermined sequence of second signals for recalling of data;
    driver circuits for generating said first and second signals, said driver circuits coupled to said cells;
    state logic means for initiating the generation of said first and second sequence of said first and second signals, respectively, comprising a plurality of logic circuits each of which has discrete states, output signals from said logic circuits being coupled as inputs to said logic circuits for determining said states and being coupled to said driver circuits, said first and second signals also being coupled to said logic circuits as inputs for said determination of said states;
    control circuit means for receiving a plurality of externally generated control signals and for generating internal control signals which are coupled as inputs to said logic circuits,
    whereby said first and second signals are generated in said first and second predetermined sequences, respectively.

2. The memory defined by claim 1 including precision timing means for causing at least one of said first signals to have a precise predetermined duration, said timing means being coupled to said state logic means and said driver circuits.

3. The memory defined by claim 2 wherein said timing means includes a temperature compensated oscillator.

4. The memory defined by claim 3 wherein said oscillator includes a capacitor which is charged through a constant current source.

5. The memory defined by claim 4 wherein said constant current source comprises two depletion mode transistors coupled to a zero voltage threshold transistor, said latter transistor for providing temperature compensation.

6. The memory defined in claim 1 wherein said logic circuits comprise a plurality of gates and a plurality of bistable circuits.

7. The memory defined by claim 6 wherein said memory cells each comprise:
    a static memory cell;
    an electrically programmable and electrically erasable ($E^2$) memory cell coupled to said static cell through a first transistor, the gate of first transistor being coupled to receive a clock signal;
    one terminal of said $E^2$ cell being coupled to receive a clear signal through a second transistor; and,
    the control gate of said $E^2$ cell being coupled to receive either a programming signal or reference signal.

8. The memory defined by claim 7 wherein said first signals comprise said clock signal, programming signal and clear signal and said second signal, said clock signal, reference signal and clear signal.

9. The memory defined by claim 8 wherein said static cell includes unbalanced loads and wherein the potential for maintaining said static cell comprises another one of said second signals.

10. An integrated circuit metal-oxide semiconductor, non-volatile memory comprising:
    a plurality of non-volatile memory cell requiring a first predetermined sequence of first signals for non-volatile storing of data and a second predetermined sequence of second signals for recalling of said stored data;
    driver circuits for generating said first and second signals, coupled to said cells;
    store state logic means for initiating said generation of said first predetermined sequence of said first signals comprising, a plurality of first logic circuits each of which has discrete states, output signals from said first logic circuits being coupled as inputs to said first logic circuits for determining first states and being coupled to said driver circuits, said first signals also being coupled to said first logic circuits as inputs for determining of said first states;
    recall state logic means for initiating said generation of said second predetermined sequence of said second signals comprising, a plurality of second logic circuits each of which has discrete states, output signals from said second logic circuits being coupled as inputs to said second logic circuits for determining second states and being coupled to said driver circuits, said second signals also being coupled to said second logic circuits as inputs for determining said second states;

control circuit means for receiving a pluraliy of externally generated control signals and for generating internal control signals which are coupled to said first and second logic circuits, whereby first and second signals are generated in said first predetermined sequence and second predetermined sequence, respectively.

11. The memory defined by claim 10 including cross-coupling between said first and second logic circuits to prevent occurrence of one of said sequences of said signals when the other of said sequences of said signals is occurring.

12. The memory defined by claim 11 including circuit means for automatically initiating said generation of said second sequence of said second signals when power applied to said memory reaches a predetermined potential.

13. The memory defined by claim 12 wherein said circuit means prevents said generation of said first signals when said power falls below a predetermined potential.

* * * * *